United States Patent
Yun et al.

(10) Patent No.: US 10,263,205 B2
(45) Date of Patent: Apr. 16, 2019

(54) ORGANIC SOLAR CELL AND MANUFACTURING METHOD THEREOF

(71) Applicant: Samsung Electronics Co., Ltd., Suwon-Si, Gyeonggi-Do (KR)

(72) Inventors: Sung Young Yun, Suwon-si (KR); In Sun Park, Hwaseong-si (KR); Jong Hwan Park, Yongin-si (KR); Yeong Suk Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 13/973,369

(22) Filed: Aug. 22, 2013

(65) Prior Publication Data

US 2014/0137929 A1    May 22, 2014

(30) Foreign Application Priority Data

Nov. 20, 2012 (KR) .......................... 10-2012-0131712

(51) Int. Cl.
*H01L 51/42* (2006.01)
*H01L 51/00* (2006.01)

(52) U.S. Cl.
CPC ...... *H01L 51/4253* (2013.01); *H01L 51/0037* (2013.01); *H01L 51/0043* (2013.01); *H01L 2251/308* (2013.01); *Y02E 10/549* (2013.01); *Y02P 70/521* (2015.11)

(58) Field of Classification Search
CPC ........................ H01L 51/4206; H01L 51/0075
See application file for complete search history.

(56) References Cited

U.S. PATENT DOCUMENTS

| | | | |
|---|---|---|---|
| 8,581,230 B2 | 11/2013 | Kim et al. | |
| 2002/0135296 A1* | 9/2002 | Aziz | H01L 51/5012 313/504 |
| 2002/0149315 A1* | 10/2002 | Blanchet-Fincher | B41M 5/38207 313/504 |
| 2008/0092945 A1* | 4/2008 | Munteanu | B82Y 30/00 136/252 |

(Continued)

FOREIGN PATENT DOCUMENTS

| | | |
|---|---|---|
| JP | 2011-040645 A | 2/2011 |
| KR | 2011-0080247 A | 7/2011 |
| KR | 10-2011-0087226 | 8/2011 |
| KR | 2012-0001045 A | 1/2012 |

(Continued)

OTHER PUBLICATIONS

Wang, et al., Journal of Physical Chemistry C, 2013, vol. 117, pp. 85-91.*

(Continued)

*Primary Examiner* — Sadie White
(74) *Attorney, Agent, or Firm* — Harness, Dickey & Pierce, P.L.C.

(57) ABSTRACT

A solar cell includes an active layer between a first electrode and a second electrode, and a transport layer between the active layer and one of the first or second electrodes. A plurality of nanoparticles are included in at least one of the active layer or the transport layer. The nanoparticles may have the same or different shapes or sizes and may be spaced differently based on location. The nanoparticles may be made of metal or a different material and the active layer may be made from an organic photovoltaic material.

16 Claims, 17 Drawing Sheets

(56) References Cited

U.S. PATENT DOCUMENTS

| | | | |
|---|---|---|---|
| 2009/0250106 A1 | 10/2009 | Hayashi et al. | |
| 2011/0088747 A1* | 4/2011 | Alstrup | H01L 27/307 136/244 |
| 2011/0297216 A1 | 12/2011 | Ihn et al. | |
| 2012/0043532 A1* | 2/2012 | Yasuda | B82Y 20/00 257/40 |
| 2012/0097229 A1* | 4/2012 | Aoki | B82Y 30/00 136/255 |
| 2013/0048059 A1 | 2/2013 | Han et al. | |
| 2013/0213477 A1* | 8/2013 | Nakayama | H01L 51/447 136/263 |
| 2014/0008636 A1* | 1/2014 | Fukuura | B82Y 20/00 257/40 |

FOREIGN PATENT DOCUMENTS

| | | | | |
|---|---|---|---|---|
| KR | 10-2012-0013770 | | 2/2012 | |
| KR | 10-2012-0075099 | | 7/2012 | |
| WO | WO2012042831 A1 | * | 4/2012 | |
| WO | WO2012/133779 | * | 10/2012 | H05B 33/02 |

OTHER PUBLICATIONS

Kalfagiannis, et al., Solar Energy Materials and Solar Cells, 2012, vol. 104, pp. 165-174.*

Shen, et al., Journal of Applied Physics, 2009, vol. 106, pp. 073109-1 to 073109-5.*

Link, et al., J. Phys. Chem. B, 1999, vol. 103, pp. 8410-8426.*

Chen, et al., Applied Physics Letters, 2009, vol. 95, pp. 013305-1 to 013305-3.*

Wang, et al., Journal of Materials Chemistry, 2012, vol. 22, pp. 1206-1211.*

Williamson, et al., Applied Physics Letters, 2011, vol. 99, pp. 093307-1 through 093307-3.*

Wu et al, American Chemical Society, Nano, vol. 5, No. 2, p. 959-967.*

Wang et al, "Enhanced Power Conversion Efficiency in PCDTBT/$PC_{70}BM$ Bulk Heterojunction Photovoltaic Devices with Embedded Silver Nanoparticle Clusters," Advanced Energy Materials, 2011, p. 766-770, Wiley-VCH Verlag GmbH & Co. KGaA, Weinheim.

Korean Office Action dated Jul. 5, 2018 for corresponding Korean Patent Application No. 10-2012-0131712 (with English translation).

* cited by examiner

ORGANIC SOLAR CELL AND MANUFACTURING METHOD THEREOF

CROSS-REFERENCE TO RELATED APPLICATIONS

This application claims priority to 35 U.S.C. § 119 to Korean Patent Application No. 10-2012-0131712 filed in the Korean Intellectual Property Office on Nov. 20, 2012, the entire contents of which are incorporated herein by reference.

BACKGROUND

1. Field

Example embodiments relate to a solar cell and a manufacturing method thereof.

2. Description of the Related Art

Fossil fuels, such as coal and petroleum, are used as energy sources.

However, fossil fuels are being exhausted and reportedly cause global warming and environmental pollution. Solar light, tidal power, wind power, geothermal heat and other forms of sustainable energy are being studied as alternative energy sources for replacing fossil fuels.

Among them, technology for converting solar light into electricity takes the lead. Various materials and devices are being developed for solar cells that convert solar light into electricity. Recently, organic solar cells using polymers have been developed. Although the organic solar cells may be light-weight, less costly and versatile, ones developed thus far have poorer efficiency than inorganic solar cells.

SUMMARY

According to example embodiments, an organic solar cell includes: a substrate; a first electrode on the substrate; an active layer on the first electrode, the active layer including an organic photovoltaic material; an electron transport layer on the active layer, the electron transport layer including an organic material; a second electrode on the electron transport layer; and a plurality of first metal nanoparticles disposed in the electron transport layer at least in part.

The first metal nanoparticles may have a size from about 10 nm to about 70 nm. The first metal nanoparticles may have a size from about 50 nm to about 70 nm, and a distance between the first metal nanoparticles may be equal to or greater than about twice the size of the first metal nanoparticles.

The first metal nanoparticles may include at least one selected from silver (Ag), gold (Au), copper (Cu), and aluminum (Al). The first metal nanoparticles may include at least one selected from silver (Ag), gold (Au), and copper (Cu). The first metal nanoparticles may be one of spherical, tetrahedral, or cubic. Also, the electron transport layer may include TiOx.

The organic solar cell may further include a plurality of second metal nanoparticles disposed in the active layer at least in part. The organic solar cell may further include: a hole transport layer between the first electrode and the active layer, the hole transport layer including an organic material; and a plurality of second metal nanoparticles disposed in the hole transport layer at least in part.

According to example embodiments, an organic solar cell includes: a substrate; a first electrode on the substrate; an active layer on the first electrode, the active layer including an organic photovoltaic material; a second electrode on the active layer; and a plurality of metal nanoparticles disposed in the electron transport layer at least in part, wherein centers of the metal nanoparticles are disposed above a middle of the active layer.

The metal nanoparticles may have a size from about 10 nm to about 70 nm. The metal nanoparticles may have a size from about 50 nm to about 70 nm, and a distance between the metal nanoparticles may be equal to or greater than about twice the size of the metal nanoparticles.

The metal nanoparticles may include at least one selected from silver (Ag), gold (Au), copper (Cu), and aluminum (Al). The metal nanoparticles may include at least one selected from silver (Ag), gold (Au), and copper (Cu). The metal nanoparticles may be one of spherical, tetrahedral, or cubic.

The organic solar cell may further include: a hole transport layer between the first electrode and the active layer, the hole transport layer including an organic material; and an electron transport layer between the second electrode and the active layer, the electron transport layer including an organic material.

According to example embodiments, a method of manufacturing an organic solar cell includes: forming a first electrode on a substrate; forming a hole transport layer on the first electrode, the hole transport layer including an organic material; forming an active layer on the hole transport layer, the active layer including an organic photovoltaic material; spreading a plurality of metal nanoparticles into an organic solution; coating the organic solution including the metal nanoparticles on the active layer to form an electron transport layer; and forming a second electrode on the electron transport layer. The metal nanoparticles may have a size from about 10 nm to about 70 nm.

The metal nanoparticles may have a size from about 50 nm to about 70 nm, and a distance between the metal nanoparticles may be equal to or greater than about twice the size of the metal nanoparticles. Also, the metal nanoparticles may include at least one selected from silver (Ag), gold (Au), and copper (Cu).

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
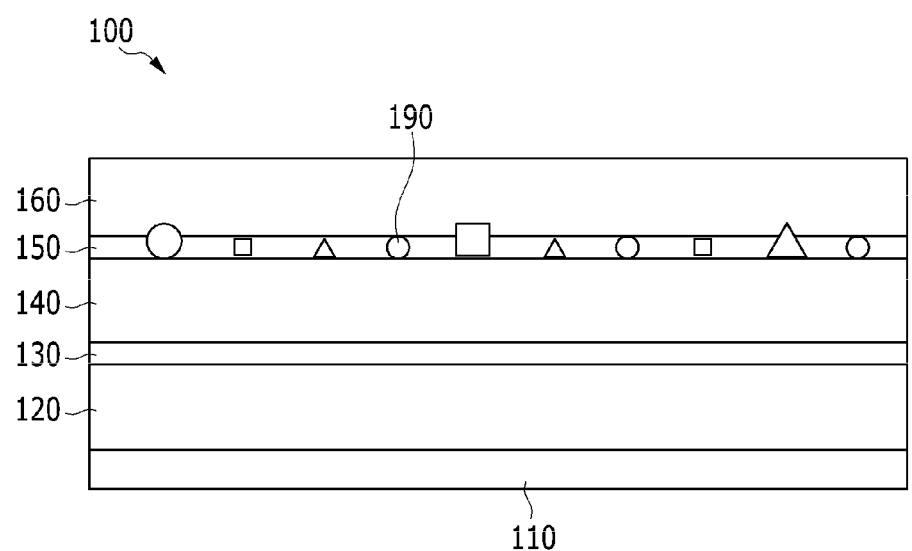
FIG. 1 is a schematic sectional view of an organic solar cell according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present.

Like reference numerals in the drawings denote like elements, and thus their description will not be repeated. As used herein, the term "and/or" includes any and all combinations of one or more of the associated listed items. Expressions such as at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Figure 2:
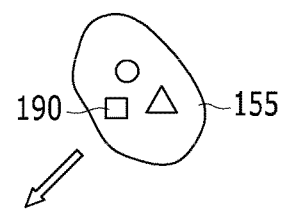
FIG. 2 to FIG. 4 are schematic sectional views illustrating a method of manufacturing an organic solar cell according to example embodiments.
Figure 2:
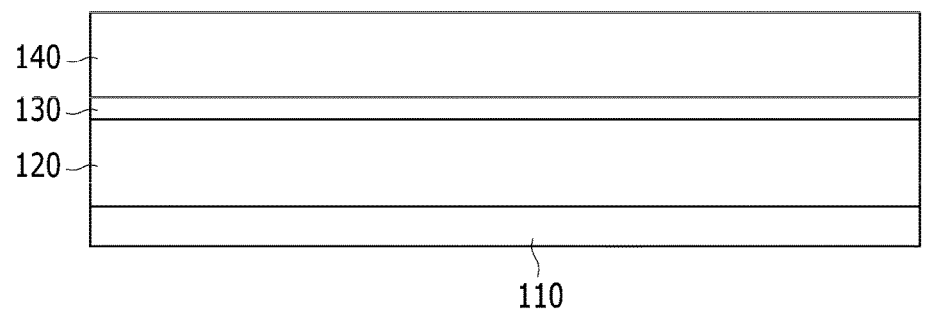
Figure 3:
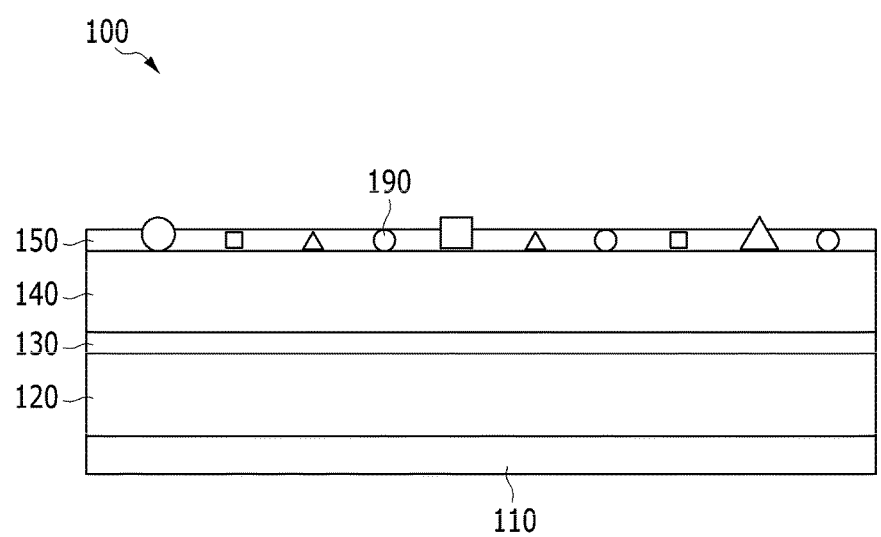
Figure 4:
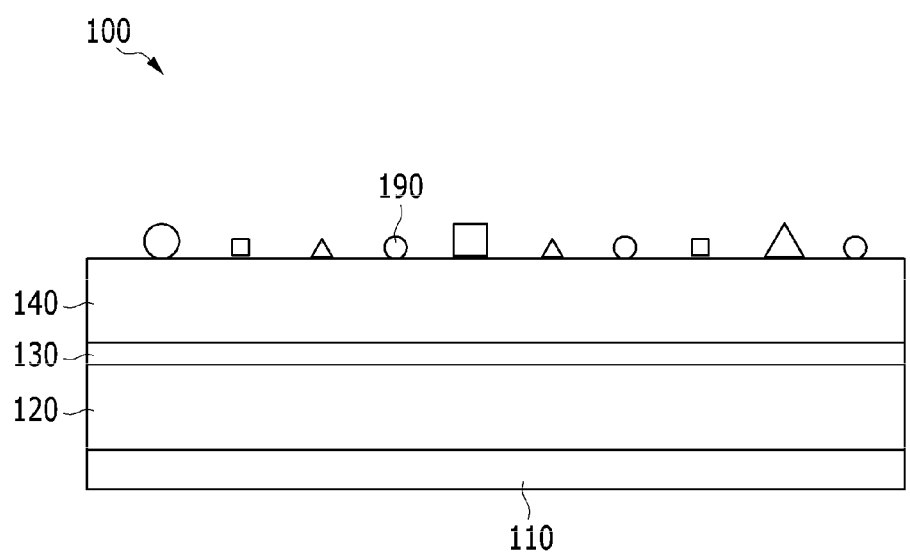

An organic solar cell and a manufacturing method thereof according to example embodiments are described in detail with reference to FIG. 1 to FIG. 4. More specifically, FIG. 1 is a schematic sectional view of an organic solar cell according to example embodiments, and FIG. 2 to FIG. 4 are schematic sectional views illustrating a method of manufacturing an organic solar cell according to example embodiments.

Referring to FIG. 1, a solar cell 100 according to example embodiments may include a substrate 110 and may further include a first electrode (or a lower electrode) 120, a hole transport layer ("HTL") 130, an active layer 140, an electron transport layer ("ETL") 150, and a second electrode (or an upper electrode) 160, which are deposited on the substrate 110. These features may be deposited sequentially or with one or more intervening layers. The solar cell 100 according to example embodiments may further include a plurality of metal nanoparticles 190 disposed at least in the ETL 150.

The substrate 110 may include a transparent insulator, for example, made of glass or plastic.

The first electrode 120 is disposed on the substrate 110 and may include a transparent conductor, for example, indium tin oxide (ITO) or indium zinc oxide (IZO). The first electrode 120 may have a thickness from about 30 nm to about 300 nm or another thickness based, for example, on the intended application or the materials used.

The second electrode 160 is disposed on the ETL 150 and may include a low-resistivity metal corresponding, for example, to one or more of copper (Cu), aluminum (Al), silver (Ag), gold (Au), a carbon nanotube (CNT), graphene, ITO, or fluorine doped tin oxide (FTO). The second electrode 160 may have a thickness from about 30 nm to about 300 nm or another thickness based, for example, on the intended application.

The active layer 140 is disposed between the first electrode 120 and the second electrode 160 and may absorb photons to produce electrons and holes. The active layer 140 may include an organic photovoltaic material, for example, at least one of an organic semiconductor, a monomer, or a polymer. The active layer 140 may have a thickness from about 30 nm to about 300 nm.

The active layer 140 may have a single-layered structure, a dual-layered structure, a bulk heterojunction structure, or a gradual heterojunction structure. The active layer 140 of a single-layered structure may include one or more of phthalocyanine ("Pc"), polyacetylene, polythiophene, or poly(p-phenylene vinylene) ("PPV"). In an example embodiment, the active layer 140 include at least two selected from polyaniline, polypyrrole, polythiophene, PPV, poly[2-methoxy-5-(2'-ethyl-hexyloxy)-1,4-phenylene vinylene ("MEH-PPV"), poly(2-methoxy-5-(3,7-dimethyloctyloxy)-1,4-phenylene-vinylene ("MDMO-PPV"), pentacene, poly (3,4-ethylenedioxythiophene) ("PEDOT"), poly(3-alkylthiophene), poly((4,8-bis(2-ethylhexyloxy)benzo(1,2-b:4,5-b')dithiophene-2,6-diyl)-alt-(2-((2-ethylhexyloxy) carbonyl)-3-fluorothieno(3,4-b)thiophenediyl)) (PTB7), (poly(substituted-benzo(1,2-b:4,5-b')dithiophene-2,6-diyl)-alt-(2-substituted-3-fluorothieno(3,4-b)thiophenediyl)), phthalocyanine, tin (II) phthalocyanine (SnPc), copper phthalocyanine, triarylamine, bezidine, pyrazoline, styrylamine, hydrazone, carbazole, thiophene, 3,4-ethylenedioxythiophene (EDOT), pyrrole, phenanthrene, tetracene, naphthalene, rubrene, 1,4,5,8-naphthalene-tetracarboxylic dianhydride ("NTCDA"), tris(8-hydroxyquinolinato)aluminium ("Alq3"), fullerenes (C60, C70, C74, C76, C78, C82, C84, C720, C860, etc.), 1-(3-methoxy-carbonyl)propyl-1-phenyl(6,6)C61 ("PCBM"), C71-PCBM, C84-PCBM, bis-PCBM, perylene, CdS, CdTe, CdSe, ZnO, derivatives of the above-listed materials, or combinations of the above-listed materials.

The active layer 140 of a dual-layered structure, a bulk heterojunction structure, or a gradual heterojunction structure may include an electron acceptor and an electron donor. The electron acceptor may include at least one of C60, C70, 3,4,9,10-perylene tetracarboxylic bisbenzimidazole ("PTCBI"), [6,6]-phenyl-C61-butyric acid methyl ester ("PCBM"), perylene, or derivatives thereof, for example. Examples of the electron donor may include NN-dimethyl quinacridone ("NNQA"), MEH-PPV, and phthalocyanine.

The HTL 130 is disposed between the active layer 140 and the first electrode 120, and may help the holes generated in the active layer 140 move toward the first electrode 120. The HTL 130 may be also referred to as an electron blocking layer, and may include at least one selected from organic materials such as poly(3,4-ethylenedioxythiophene) poly (styrenesulfonate) ("PEDOT:PSS") or 4,4',4"-Tris(N-(2-naphthyl)-N-phenyl-amino)-triphenylamine ("2TNATA") or inorganic materials such as a molybdenum oxide or a zinc oxide, for example. The HTL 130 may have a thickness from about 10 nm to about 100 nm. The HTL 130 may be omitted.

The ETL 150 is disposed between the active layer 140 and the second electrode 160 and may help the electrons generated in the active layer 140 move toward the second electrode 160. The ETL 150 may be also referred to as an hole blocking layer and may include at least one selected from TiOx, 4,7-diphenyl-1,10-phenanthroline ("Bphen"), benocyclidine (BCP), 1,3,5-Tris(1-phenyl-1H-benzimidazol-2-yl)benzene ("TPBI"). The ETL 150 may have a thickness from about 1 nm to about 100 nm or another thickness based, for example, on the intended application or materials used.

The metal nanoparticles 190 may include at least one selected from silver (Ag), gold (Au), copper (Cu), aluminum (Al), and may have various shapes, for example, sphere, tetrahedron, hexahedron or even an irregular shape. The metal nanoparticles 190 may have a size, for example, from about 10 nm to about 70 nm and may be arranged by a distance equal to or greater than about twice the size thereof when their sizes are from about 50 nm to about 70 nm. The sizes of metal nanoparticles 190 may be greater than the thickness of the ETL 150. However, the shapes, the materials, and the sizes of the metal nanoparticles 190 are not limited thereto. Also, in some example embodiments, nanoparticles 190 may be made from silicon, a conductive polymer, an oxide or other dielectric material.

According to example embodiments, the metal nanoparticles 190 may be disposed in at least one of or both of the active layer 140 and the HTL 130 as well as in the ETL 150.

The first and second electrodes 120 and 160 may be formed by sputtering, etc., and the active layer 140, the HTL 130, and the ETL 150 may be formed by a solution process or evaporation.

When the ETL 150 is formed by a solution process, referring to FIG. 2, the metal nanoparticles 190 may be spread in a solution 155 for forming the ETL 150 and, thereafter, referring to FIG. 3, the solution 155 may be coated on the active layer 140. When the ETL 150 is formed by evaporation, referring to FIG. 4, the metal nanoparticles 190 may be spread on the active layer 140, and thereafter, the ETL 150 may be deposited thereon.

A light such as solar light may be incident from the substrate 110 of the solar cell 100. The metal nanoparticles 190 spread into the ETL 150 may increase photoelectric conversion efficiency.

An organic solar cell and a manufacturing method thereof according to example embodiments are described in detail with reference to FIG. 5 to FIG. 7.

Figure 5:
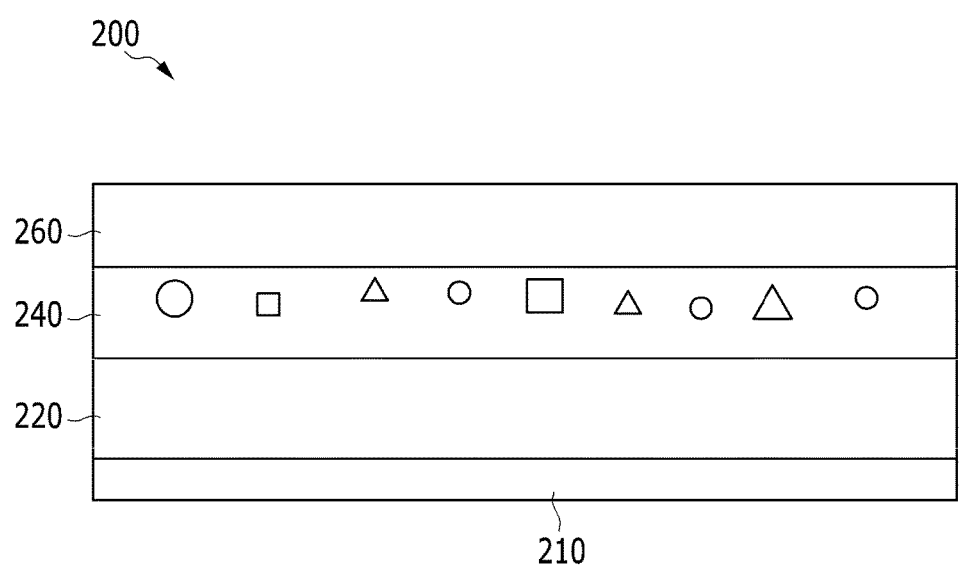
FIG. 5 is a schematic sectional view of an organic solar cell according to example embodiments.
Figure 6:
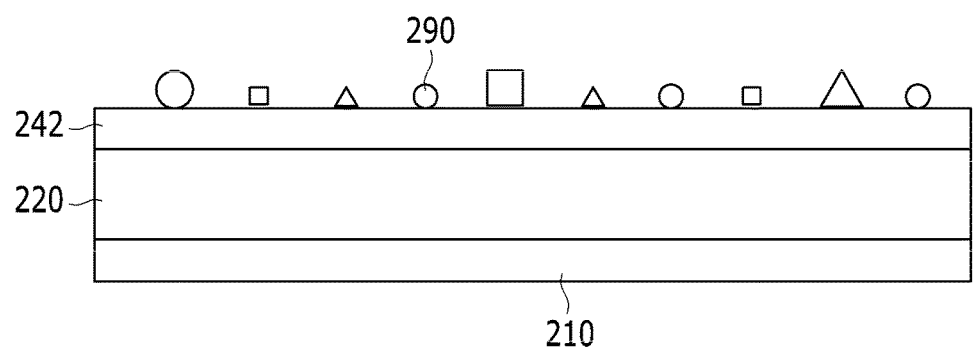
FIG. 6 and FIG. 7 are schematic sectional views illustrating a method of manufacturing an organic solar cell according to example embodiments.
Figure 7:
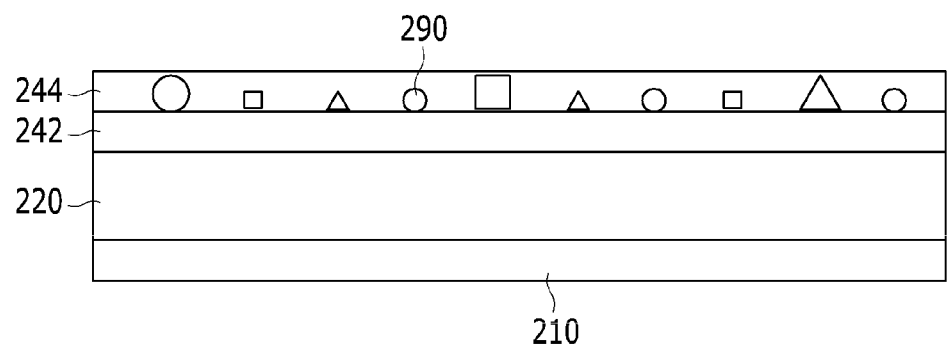

FIG. 5 is a schematic sectional view of an organic solar cell according to example embodiments, and FIG. 6 and FIG. 7 are schematic sectional views illustrating a method of manufacturing an organic solar cell according to example embodiments.

Referring to FIG. 5, a solar cell 200 according to example embodiments may include a substrate 210 and may further include a first electrode (or a lower electrode) 220, an active layer 240, and a second electrode (or an upper electrode) 260, which are deposited on the substrate 210 with or without one or more intervening layers.

The solar cell 200 further includes a plurality of metal nanoparticles 290 disposed in the active layer 240. Centers of the metal nanoparticles 290 may be disposed closer to a top surface of the active layer 240 than a bottom surface thereof. The shapes, the materials, and the sizes of the metal nanoparticles 290 may be substantially the same as the metal nanoparticles 190 described with reference to FIG. 1.

The active layer 240, the first and second electrodes 220 and 260, and the substrate 210 may be substantially the same as the active layer 140, the first and second electrodes 120 and 160, and the substrate 110 shown in FIG. 1.

According to an embodiment, the solar cell 200 may further include at least one of the HTL 130 and the ETL 150 shown in FIG. 1, and at least one of the HTL 130 or the ETL 150 may include metal nanoparticles.

The first and second electrodes 220 and 260 may be formed by sputtering, etc., and the active layer 240 may be formed by a solution process or evaporation. When the active layer 240 is formed by evaporation, referring to FIG. 6, a portion 242 of the active layer 240 may be deposited on the substrate 110, and the metal nanoparticles 290 may be spread thereon. Thereafter, referring to FIG. 7, a remaining portion 244 of the active layer 240 may be deposited thereon.

The metal nanoparticles 290 spread in an upper portion of the active layer 240 may increase photoelectric conversion efficiency.

An organic solar cell according to example embodiments is described in detail with reference to FIG. 8.

Figure 8:
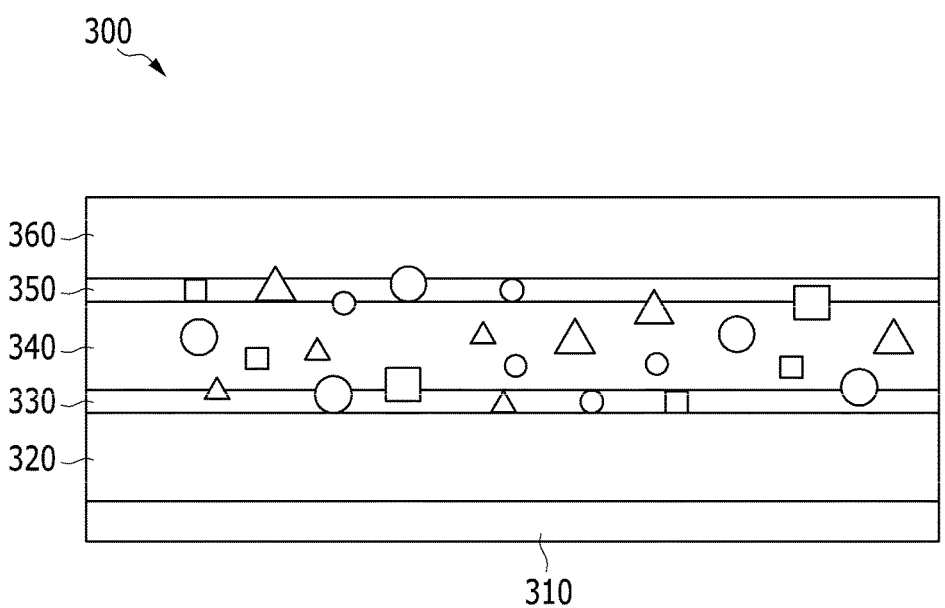
FIG. 8 is a schematic sectional view of an organic solar cell according to example embodiments.

FIG. 8 is a schematic sectional view of an organic solar cell according to example embodiments.

Referring to FIG. 8, a solar cell 300 according to example embodiments may include a substrate 310 and may further include a first electrode (or a lower electrode) 320, a HTL 330, an active layer 340, an ETL 350, and a second electrode (or an upper electrode) 360, which are deposited in sequence on the substrate 310.

The solar cell 300 further includes a plurality of metal nanoparticles 390 disposed in the ETL 350, the active layer 340, and the HTL 330. The shapes, the materials, and the sizes of the metal nanoparticles 390 may be substantially the same as the metal nanoparticles 190 described with reference to FIG. 1.

The active layer 340, the ETL 350, HTL 330, the first and second electrodes 320 and 360 and the substrate 310 may be substantially the same as the active layer 140, the ETL 150, HTL 130, the first and second electrodes 120 and 160, and the substrate 110 shown in FIG. 1. The metal nanoparticles 390 spread in an upper portion of the ETL 350, the active layer 340, and the HTL 330 may increase photoelectric conversion efficiency.

The light absorption of an organic solar cell may depend on positions of metal nanoparticles, which is described with reference to FIG. 9 to FIG. 11.

Figure 9:
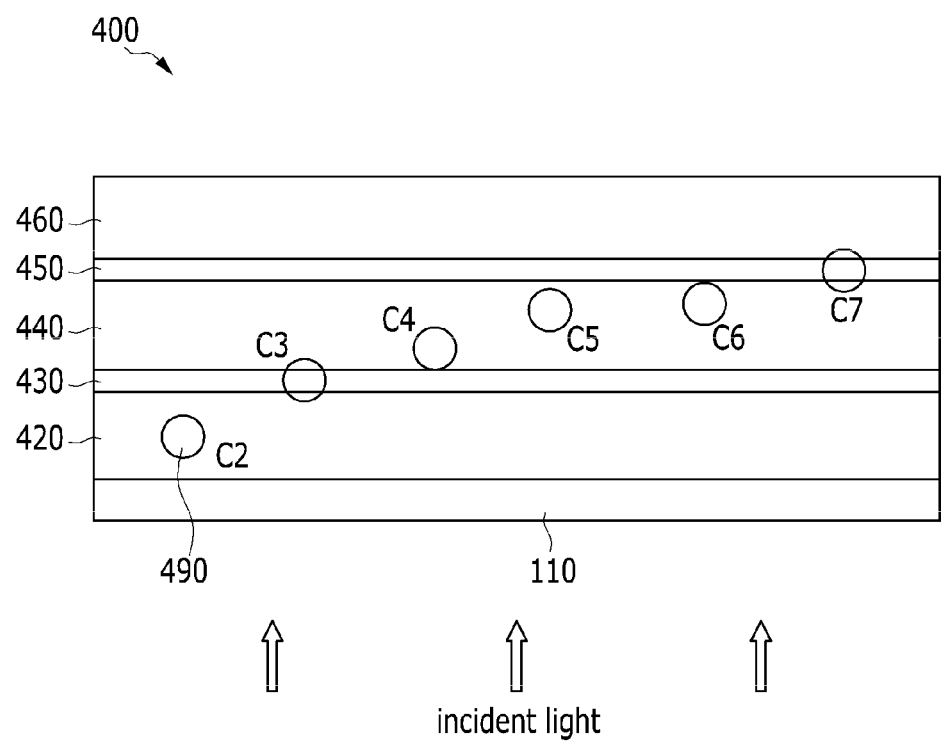
FIG. 9 is a schematic sectional view of an organic solar cell according to computer simulation examples.
Figure 10:
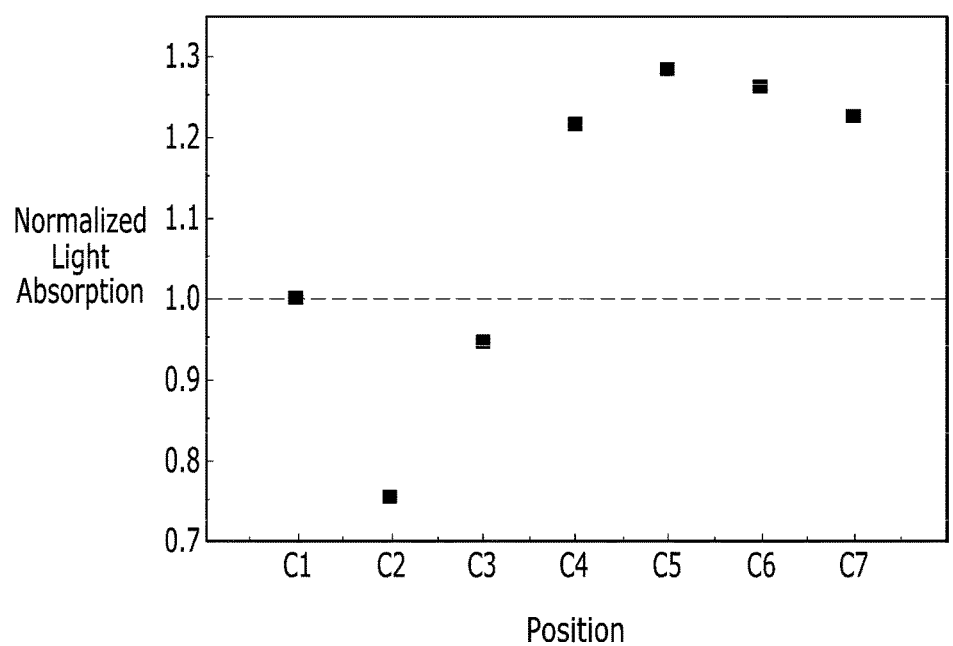
FIG. 10 is a graph illustrating normalized light absorption of the organic solar cell as function of position of metal nanoparticles.
Figure 11:
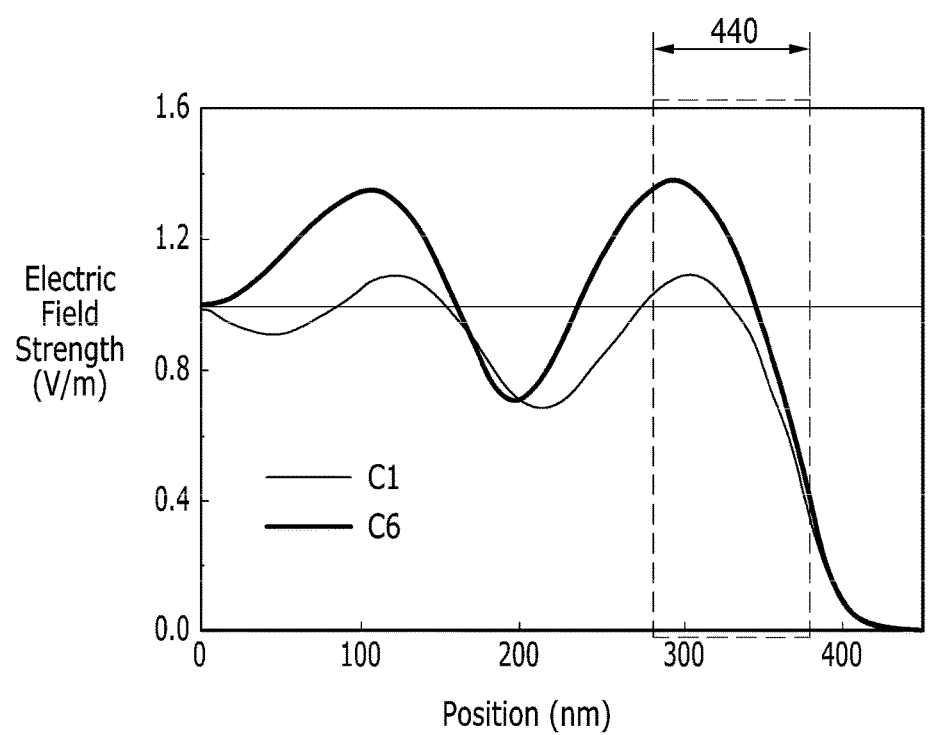
FIG. 11 is a graph illustrating electric field strength of incident light as function of position in the organic solar cell in an example C6.

FIG. 9 is a schematic sectional view of an organic solar cell according to computer simulation examples, FIG. 10 is a graph illustrating normalized light absorption of the organic solar cell as function of position of metal nanoparticles, and FIG. 11 is a graph illustrating electric field strength of incident light as function of position in the organic solar cell in an example C6.

An organic solar cell 400 shown in FIG. 9 is prepared by computer simulation and light absorption for various positions of metal nanoparticles is calculated.

A substrate 410 includes glass and has a thickness of about 100 nm. A first electrode 420 is an ITO layer with a thickness of about 150 nm and a second electrode 40 is an Al layer with a thickness of about 70 nm. An active layer 440 has a thickness of about 100 nm, and includes a combination of poly((4,8-bis(2-ethylhexyloxy)benzo(1,2-b:4,5-b')dithiophene-2,6-diyl)(2-((2-ethylhexyloxy)carbonyl)-3-fluorothieno(3,4-b)thiophenediyl)) and C71-PCBM. A HTL 430 is a PEDOT layer with a thickness of about 30 nm, and an ETL 450 is a TiOx layer with a thickness of about 7 nm. Each of metal nanoparticles 490 is a gold (Au) sphere having a diameter of about 50 nm.

Referring to FIG. 9 and FIG. 10, C1 denotes an example without the metal nanoparticles 490 and the light absorption of C1 is regarded as a reference. C2 denotes an example where the metal nanoparticles 490 are disposed in the first electrode 420 and C3 denotes an example where the metal nanoparticles 490 are disposed in the HTL 430. C4 denotes an example where the metal nanoparticles 490 are disposed in a lower portion of the active layer 440 and C5 denotes an example where a distance between top of the metal nanoparticles 490 and a top surface of the active layer 440 is about 10 nm. C6 denotes an example where the top of the metal nanoparticles 490 is aligned with the top surface of the active layer 440 and C7 denotes an example where centers of the metal nanoparticles 490 are disposed at a middle of the ETL 450.

Referring to FIG. 10, the examples C4-C7 where the metal nanoparticles 490 are disposed in the active layer 440 or the ETL 450 have higher light absorption than the example C1 without the metal nanoparticles 490. When the metal nanoparticles 490 are disposed in the active layer 440, the examples C5 and C6 where the centers of the metal nanoparticles 490 are disposed above the middle of the active layer 240 (or above a position of a half of the thickness of the active layer 240) have higher light absorption than the example C4 where the centers of the metal nanoparticles 490 are disposed below the middle of the active layer 240.

FIG. 11 illustrates electric field strength of incident light in the organic solar cell 400 as function of position when the origin of the position is a bottom surface of the substrate 410. The incident light proceeds from the substrate 410 and the field strength is evaluated relative to a value of the incident light right after the light enters the organic solar cell 400. As shown in FIG. 11, when the top of the metal nanoparticles 490 is aligned with the top surface of the active layer 440 as in the example C6, the electric field rapidly drops down in the active layer 440. Therefore, the amount of light absorbed by the active layer 440 is greater in the example C6 where the top of the metal nanoparticles 490 is aligned with the top surface of the active layer 440 than the example C1 without the metal nanoparticles 490.

The organic solar cells 400 as shown in FIG. 9 were actually manufactured and various characteristics thereof were measured, which are shown in Table 1, Table 2, and Table 3 provided below.

Table 1 illustrates characteristics of an example where the metal nanoparticles 490 are spread in the HTL 430.

Table 2 illustrates characteristics of an example where the metal nanoparticles 490 are spread in the active layer 440.

Table 3 illustrates characteristics of an example where the metal nanoparticles 490 are spread in the ETL 450. The concentration of the metal nanoparticles 490 in Tables 1-3 is the weight percentage thereof relative to the total weight of a corresponding layer, which is the HTL 430 in Table 1, the active layer 440 in Table 2, and the ETL 450 in Table 3.

The materials and thicknesses of the layers 410-460 were substantially the same as those in the above-described simulation examples. The first and second electrodes 420 and 460 were formed by sputtering, and the HTL 430, the active layer 440, and the ETL 450 were formed by solution process. The metal nanoparticles 490 were silver (Ag) particles with a size of about 50 nm. The metal nanoparticles 490 were spread in a solution for the HTL 430, the active layer 440, or the ETL 450, and then the solution was coated.

TABLE 1

| Concentration (weight %) | Voc (mV) | Jsc (mA/cm2) | FF (%) | Maximum PCE (%) | PCE (%) |
|---|---|---|---|---|---|
| 0 | 786.2 | 15.6 | 67.3 | 8.36 | 8.32 ± 0.04 |
| 2 | 796.2 | 15.0 | 67.7 | 8.09 | 8.01 ± 0.06 |
| 3 | 796.2 | 14.7 | 67.6 | 7.91 | 7.85 ± 0.06 |
| 4 | 786.2 | 15.5 | 67.1 | 8.18 | 8.08 ± 0.14 |
| 5 | 786.2 | 15.7 | 66.6 | 8.22 | 8.14 ± 0.11 |
| 6 | 786.2 | 15.6 | 65.3 | 8.01 | 7.79 ± 0.34 |

TABLE 2

| Concentration (weight %) | Voc (mV) | Jsc (mA/cm2) | FF (%) | Maximum PCE (%) | PCE (%) |
|---|---|---|---|---|---|
| 0 | 776.1 | 16.0 | 66.6 | 8.27 | 8.21 ± 0.09 |
| 0.1 | 776.1 | 16.0 | 68.7 | 8.53 | 8.48 ± 0.06 |
| 0.5 | 776.1 | 16.1 | 68.7 | 8.58 | 8.50 ± 0.07 |

TABLE 3

| Concentration (weight %) | Voc (mV) | Jsc (mA/cm2) | FF (%) | Maximum PCE (%) | PCE (%) |
|---|---|---|---|---|---|
| 0 | 786.2 | 15.4 | 67.7 | 8.19 | 8.12 ± 0.065 |
| 5 | 786.2 | 16.1 | 68.9 | 8.72 | 8.64 ± 0.06 |
| 10 | 786.2 | 15.9 | 69.0 | 8.63 | 8.41 ± 0.13 |
| 15 | 796.2 | 15.9 | 68.2 | 8.63 | 8.29 ± 0.14 |
| 20 | 786.2 | 15.6 | 69.5 | 8.52 | 8.21 ± 0.26 |

In Tables 1-3, Voc denotes open circuit voltage, Jsc denotes short-circuit current, FF denotes fill factor, and PCE denotes power conversion efficiency.

Referring to Tables 1-3, PCE of the example with the metal nanoparticles 490 in the HTL 430 decreases by at least about 2.2% (=(8.32−8.14)/8.32). PCE of the example with the metal nanoparticles 490 in the active layer 440 is increased by up to about 3.5% (=(8.50−8.21)/8.21). And, PCE of the example with the metal nanoparticles 490 in the ETL 450 is increased by up to about 6.4% (=(8.64−8.12)/8.12).

Referring to Table 3, the characteristics of the organic solar cell 400 may be the best when the concentration of the metal nanoparticles 490 is about 5% in the example with the metal nanoparticles 490 in the ETL 450.

The light absorption of an organic solar cell may depend on size and distance of metal nanoparticles, which is described with reference to FIG. 12 and FIG. 13.

Figure 12:
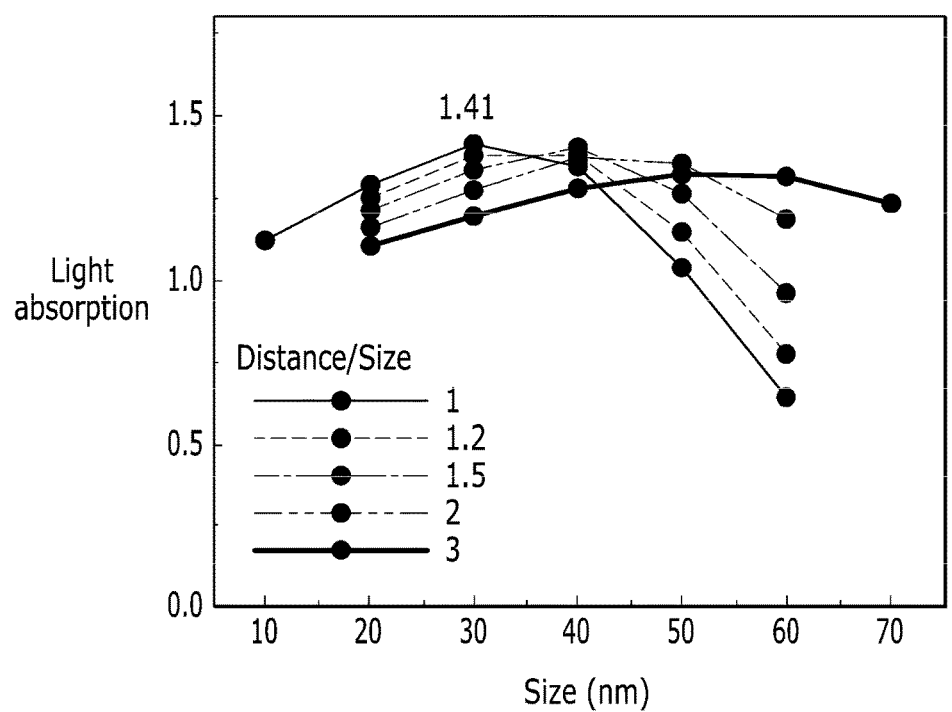
FIG. 12 is a graph illustrating light absorption of the organic solar cell for various sizes and distances of metal nanoparticles.
Figure 13:
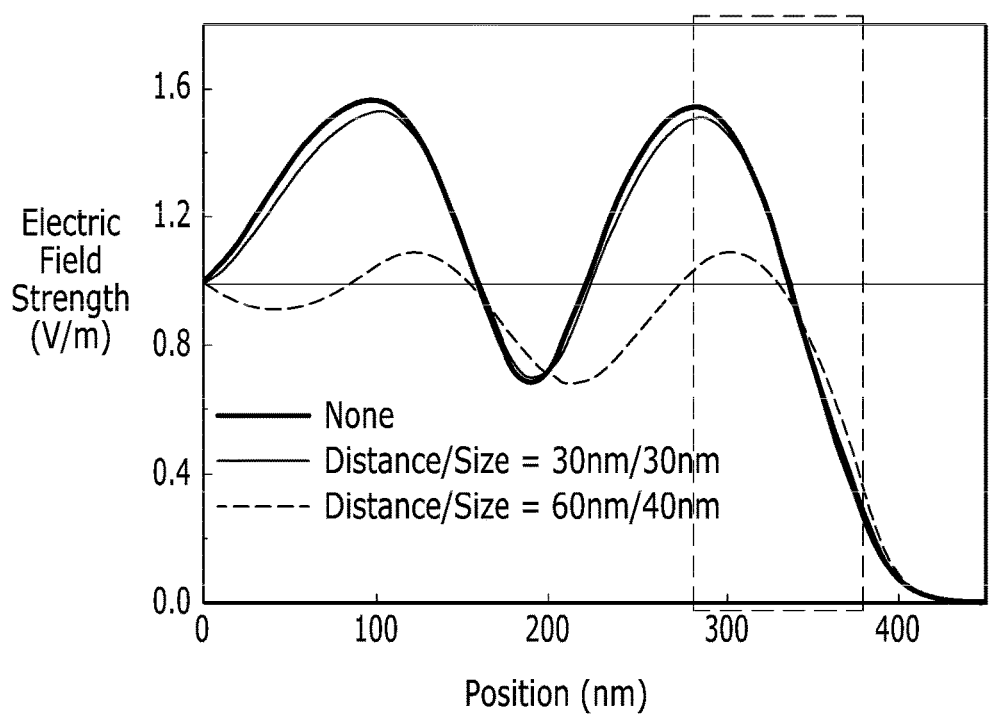
FIG. 13 is a graph illustrating electric field strength of incident light as function of position in the organic solar cell for a size and a distance of the metal nanoparticles, which maximize the light absorption.

FIG. 12 is a graph illustrating light absorption of the organic solar cell for various sizes and distances of metal nanoparticles, and FIG. 13 is a graph illustrating electric field strength of incident light as function of position in the organic solar cell for a size and a distance of the metal nanoparticles, which maximize the light absorption.

A solar cell 400 according to the example C6 shown in FIG. 9 was prepared by computer simulation and light absorption for various sizes and distances of metal nanoparticles was calculated. In this simulation, the incident light proceeds from the substrate 410 and the light absorption is evaluated relative to the example C1 without the metal nanoparticles 490.

Referring to FIG. 12, in order to obtain light absorption greater than the reference value, the distance between the metal nanoparticles 490 becomes large as the size of the metal nanoparticles 490 becomes large. In detail, when the metal nanoparticles 190 are as large as from about 10 nm to about 50 nm in this simulation, the light absorption is greater than the reference value regardless of distance. However, when the size of the metal nanoparticles 190 is from about 50 nm to about 70 nm, the distance between the metal nanoparticles 190 for obtaining light absorption greater than the reference value is equal to or greater than about twice the size.

FIG. 13 illustrates electric field strength of incident light in the organic solar cell 400 as function of position when the origin of the position is a bottom surface of the substrate 410. The incident light proceeds from the substrate 410, and the field strength is evaluated relative to a value of the incident light right after the light enters the organic solar cell 400.

Referring to FIG. 12 and FIG. 13, in this case, the light absorption is a maximum of about 1.41 when both the size and the distance of the metal nanoparticles 490 are about 30 nm and when the size is about 40 nm and the distance is about 60 nm, i.e., about 1.5 times the size.

In some example embodiments, the shape of the metal nanoparticles may not affect the light absorption of an organic solar cell, as described with reference to FIG. 14 and FIG. 15.

Figure 14:
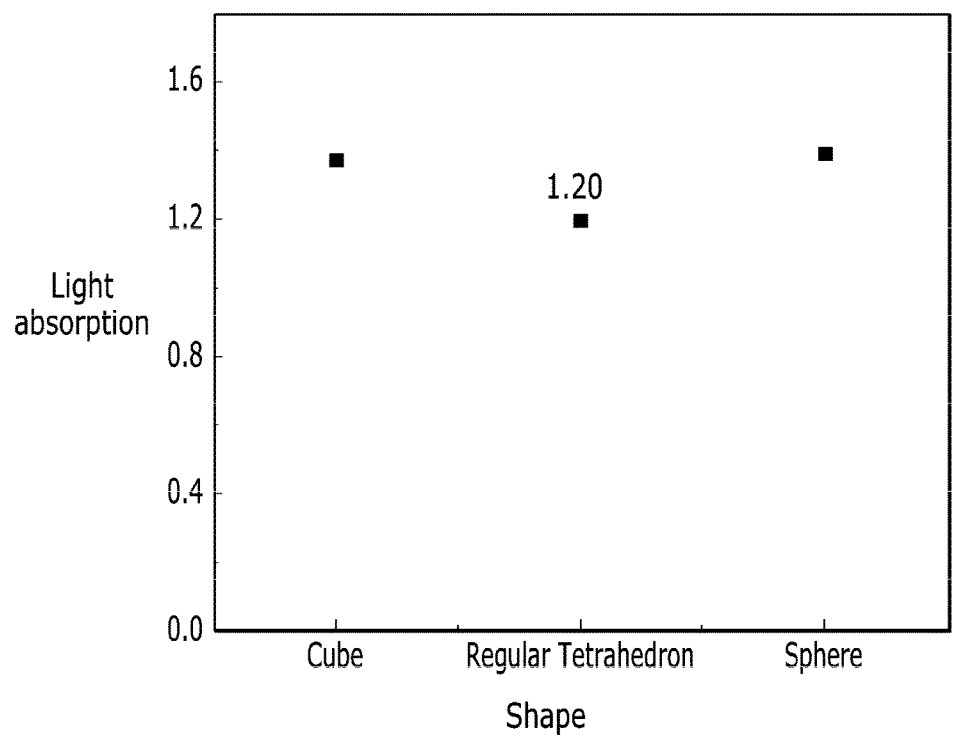
FIG. 14 is a graph illustrating light absorption of the organic solar cell for various shapes of metal nanoparticles.
Figure 15:
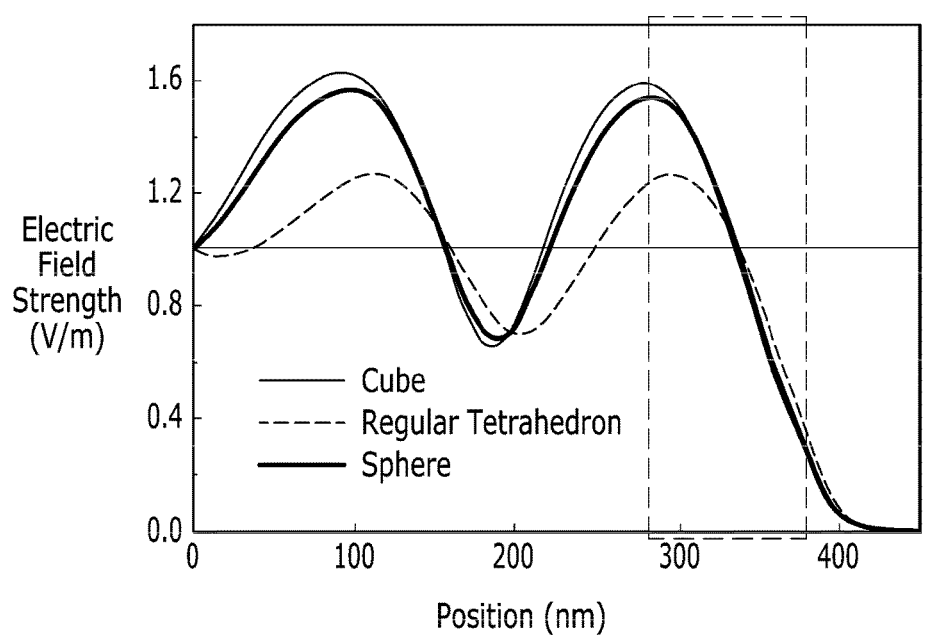
FIG. 15 is a graph illustrating electric field strength of incident light as function of position in the organic solar cell for various shapes of the metal nanoparticles.

FIG. 14 is a graph illustrating light absorption of the organic solar cell for various shapes of metal nanoparticles, and FIG. 15 is a graph illustrating electric field strength of incident light as function of position in the organic solar cell for various shapes of the metal nanoparticles.

A solar cell 400 according to example C6 shown in FIG. 9 is prepared by computer simulation and light absorption for cubic, regular tetrahedral, and spherical nanoparticles is calculated. The incident light proceeds from the substrate 410 and the light absorption is evaluated relative to the example C1 without the metal nanoparticles 490.

FIG. 15 illustrates electric field strength of incident light in the organic solar cell 400 as function of position when the origin of the position is a bottom surface of the substrate 410. The incident light proceeds from the substrate 410, and the field strength is evaluated relative to a value of the incident light right after the light enters the organic solar cell 400.

Referring to FIG. 14 and FIG. 15, the light absorption is greater than the reference value regardless of the shape of the metal nanoparticles 490. The light absorption is the lowest for regular tetrahedral metal nanoparticles, which is about 1.2.

In example embodiments, the light absorption of an organic solar cell may depend on a material of metal nanoparticles, which is described with reference to FIG. 16 and FIG. 17.

Figure 16:
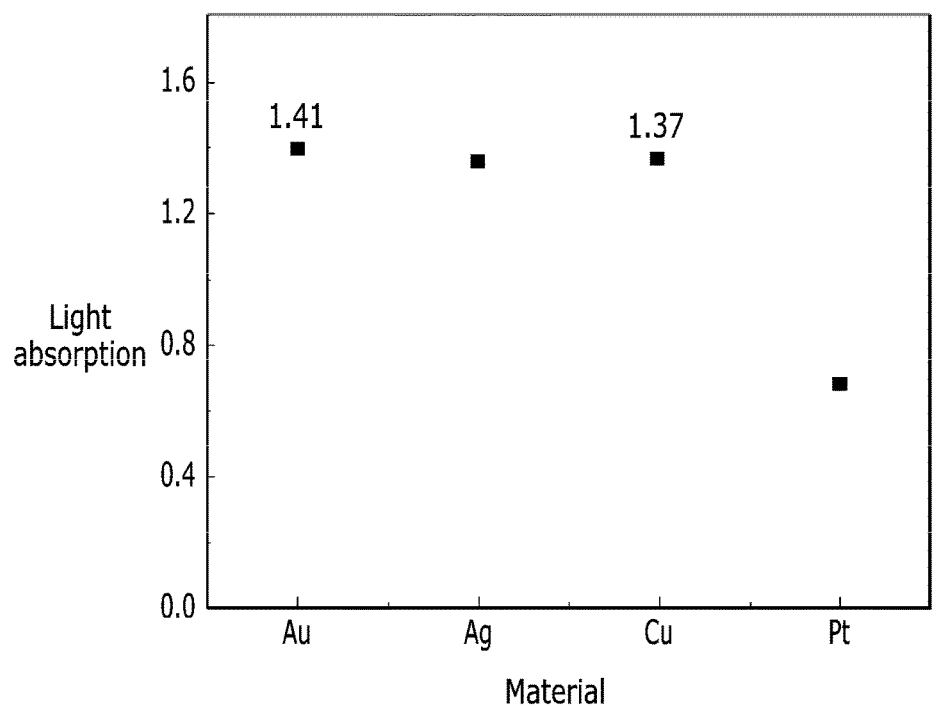
FIG. 16 is a graph illustrating light absorption of the organic solar cell for various materials of metal nanoparticles.
Figure 17:
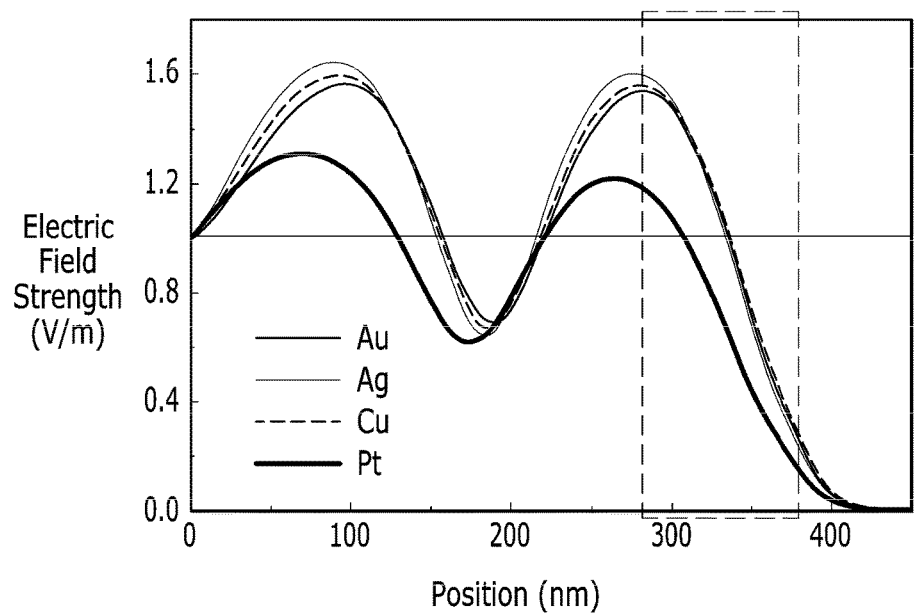
FIG. 17 is a graph illustrating electric field strength of incident light as function of position in the organic solar cell for various materials of the metal nanoparticles.

FIG. 16 is a graph illustrating light absorption of the organic solar cell for various materials of metal nanoparticles, and FIG. 17 is a graph illustrating electric field strength of incident light as function of position in the organic solar cell for various materials of the metal nanoparticles.

A solar cell 400 according to example C6 shown in FIG. 9 is prepared by computer simulation and light absorption for gold (Au), silver (Ag), copper (Cu), and platinum (Pt) nanoparticles is calculated. The incident light proceeds from the substrate 41 and the light absorption is evaluated relative to the example C1 without the metal nanoparticles 490.

FIG. 17 illustrates electric field strength of incident light in the organic solar cell 400 as function of position when the origin of the position is a bottom surface of the substrate 410. The incident light proceeds from the substrate 410 and the field strength is evaluated relative to a value of the incident light right after the light enters the organic solar cell 400.

Referring to FIG. 16 and FIG. 17, the light absorption for gold, silver, and copper nanoparticles is greater than the reference value, and the light absorption for platinum nanoparticles is smaller than the reference value.

The simulation examples and experimental examples may show that the organic solar cell having nanoparticles disposed in the ETL and/or the upper portion of the active layer has an improved photoelectric conversion efficiency. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An organic solar cell comprising:
   a first electrode;
   a second electrode;
   an active layer between the first electrode and the second electrode, the active layer including an organic photovoltaic material;
   an electron transport layer between the active layer and one of the first electrode and the second electrode, the electron transport layer including an organic material different from the organic photovoltaic material of the active layer; and
   a plurality of first metal nanoparticles, a portion of each of the first metal nanoparticles being in the electron transport layer and a size of at least one of the first metal nanoparticles being greater than a thickness of the electron transport layer such that the at least one of the first metal nanoparticles extends into and directly contacts the active layer.

2. The organic solar cell of claim 1, wherein the first metal nanoparticles have a size from about 10 nm to about 70 nm.

3. The organic solar cell of claim 2, wherein the first metal nanoparticles have a size from about 50 nm to about 70 nm, and wherein a distance between adjacent pairs of the first metal nanoparticles is equal to or greater than about twice a size of the first metal nanoparticles.

4. The organic solar cell of claim 1, wherein the first metal nanoparticles comprise at least one selected from silver (Ag), gold (Au), copper (Cu), and aluminum (Al).

5. The organic solar cell of claim 4, wherein the first metal nanoparticles comprise at least one selected from silver (Ag), gold (Au), and copper (Cu).

6. The organic solar cell of claim 1, wherein a shape of the first metal nanoparticles is at least one of spherical, tetrahedral, cubic or irregular.

7. The organic solar cell of claim 1, wherein the electron transport layer comprises $TiO_x$.

8. The organic solar cell of claim 1, further comprising:
   a plurality of second metal nanoparticles, each of the plurality of second metal nanoparticles including a portion in the active layer.

9. The organic solar cell of claim 1, further comprising:
   a hole transport layer between the first electrode and the active layer, the hole transport layer including an organic material; and
   a plurality of second metal nanoparticles, each of the plurality of second metal nanoparticles including a portion in the hole transport layer.

10. The solar cell of claim 8, wherein
    the active layer has a first surface and a second surface,
    the first surface is closer to the electron transport layer than the second surface,
    a first number of the second metal nanoparticles is located between a center of the active layer and the first surface of the active layer, and
    a second number of the second metal nanoparticles has surfaces substantially coincident with the first surface of the active layer, a light absorption level corresponding to the first number of the second metal nanoparticles being different from a light absorption level corresponding to the second number of the second metal nanoparticles.

11. The solar cell of claim 1, wherein
    a first number of the first metal nanoparticles have sizes which lie in a first range,
    a second number of the first metal nanoparticles have sizes which lie in a second range different from the first range, and
    a spacing between adjacent ones of the first number of the first metal nanoparticles is different from a spacing between adjacent ones of the second number of the first metal nanoparticles.

12. The solar cell of claim 11, wherein the first number of the first metal nanoparticles produces a different level of light absorption than the second number of the first metal nanoparticles based on a difference in the spacing between adjacent ones of the first number of the first metal nanoparticles and the spacing between adjacent ones of the second number of the first metal nanoparticles.

13. A method of manufacturing an organic solar cell, the method comprising:
    forming a first electrode on a substrate;
    forming a hole transport layer on the first electrode, the hole transport layer including an organic material;
    forming an active layer on the hole transport layer, the active layer including an organic photovoltaic material;
    spreading a plurality of metal nanoparticles into an organic solution;
    coating the organic solution including the metal nanoparticles on the active layer to form an electron transport layer, a portion of each of the metal nanoparticles being in the electron transport layer and a size of at least one of the metal nanoparticles being greater than a thickness of the electron transport layer such that the at least one of the metal nanoparticles extends into and directly contacts the active layer; and
    forming a second electrode on the electron transport layer.

14. The method of claim 13, wherein the metal nanoparticles have a size from about 10 nm to about 70 nm.

15. The method of claim 14, wherein the metal nanoparticles have a size from about 50 nm to about 70 nm, and a distance between the metal nanoparticles is equal to or greater than about twice the size of the metal nanoparticles.

16. The method of claim 13, wherein the metal nanoparticles comprise at least one selected from silver (Ag), gold (Au), and copper (Cu).

* * * * *